(12) United States Patent
Beer (10) Patent No.: US 6,737,695 B2
(45) Date of Patent: May 18, 2004

(54) MEMORY MODULE HAVING A MEMORY CELL AND METHOD FOR FABRICATING THE MEMORY MODULE

(75) Inventor: Peter Beer, Tutzing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/156,536

(22) Filed: May 28, 2002

(65) Prior Publication Data

US 2002/0175360 A1 Nov. 28, 2002

(30) Foreign Application Priority Data

May 26, 2001 (DE) .......................... 101 25 800

(51) Int. Cl.$^7$ ..................... H01L 27/108; H01L 29/76; H01L 29/94; H01L 31/119; H01L 21/8242
(52) U.S. Cl. ..................... 257/300; 257/296; 257/301; 257/302; 438/243; 438/386; 438/242; 438/238; 438/239
(58) Field of Search .................. 257/300, 301, 257/302, 296; 438/396, 250, 393, 243, 386, 242, 238, 239, 399

(56) References Cited

U.S. PATENT DOCUMENTS 5,675,160 A  10/1997  Oikawa ..................... 257/296
6,404,000 B1 *  6/2002  Divakaruni et al.
2002/0024081 A1 *  2/2002  Gratz ......................... 257/301

FOREIGN PATENT DOCUMENTS

DE       197 01 003 A1   11/1997   ................. 257/300
JP         6-140597    *  5/1994   ................. 438/396

* cited by examiner

Primary Examiner—Steven Loke
(74) Attorney, Agent, or Firm—Laurence A. Greenberg; Werner H. Stemer; Ralph E. Locher (57) ABSTRACT

A memory module and a method for fabricating the memory module are described. The memory module has a memory cell that is disposed in a vertical trench. The memory cell has a first and a second transistor connected in series and the first transistor is able to be turned on via a first word line and the second transistor is able to be turned on via a charge of a capacitor. The two transistors are connected between a voltage source and a bit line. In this way, the charge state of the capacitor is evaluated by the second transistor. If the capacitor has a positive charge, then the second transistor is turned on. If, moreover, the first word line is driven, then the first transistor is also turned on. As a consequence, the bit line is connected to the voltage source and supplied with a sufficiently strong signal for evaluation.

10 Claims, 6 Drawing Sheets

MEMORY MODULE HAVING A MEMORY CELL AND METHOD FOR FABRICATING THE MEMORY MODULE

BACKGROUND OF THE INVENTION

Field of the Invention

The invention relates to a memory module having a memory cell with a first transistor and a capacitor. The capacitor is used for storing an information item and the first transistor is used for reading out and/or storing the information item from/to the capacitor. A first terminal of the first transistor is connected to a bit line.

Memory modules have a matrix of memory cells that are disposed in a form of rows and columns. The memory cells can be addressed via word lines and bit lines. The reading of data from the memory cells or the writing of data to the memory cells is carried out by the activation of the corresponding word line and of the corresponding bit line.

Known memory cells, such as e.g. of the DRAM type, usually have a transistor connected to a capacitor. In this case, a first terminal of the transistor is connected to a bit line and a second terminal of the transistor is connected to an electrode of the capacitor. The control terminal of the transistor is connected to a word line. By applying a suitable voltage to the word line the transistor is turned on and the charge stored in the capacitor is conducted via the bit line to an amplifier circuit. A central problem in known DRAM variants relates to in providing a sufficiently large capacitance of the capacitor. The size of the capacitors is continually being reduced through the increasing miniaturization of the memory modules. The decrease in size results in that the capacitance of the capacitor is also reduced. An amplifier circuit which evaluates the stored charge in the capacitor requires, for reliable functioning, a sufficiently large voltage change on the bit line during the read-out of the charge of the capacitor. The ratio of the storage capacitance to the bit time capacitance is crucial in determining the signal level that is established on the bit line during the read-out of the information from the capacitor. Therefore, the charge capacitance of the capacitor must not fall below a minimum magnitude.

SUMMARY OF THE INVENTION

It is accordingly an object of the invention to provide a memory module having a memory cell and a method for fabricating the memory module that overcome the above-mentioned disadvantages of the prior art devices and methods of this general type, which has a relatively large charge capacitance.

With the foregoing and other objects in view there is provided, in accordance with the invention, a memory module. The memory module contains a voltage potential terminal for a voltage potential, a bit line, a first word line, a second word line, and a memory cell. The memory cell has a first transistor, a second transistor, a third transistor, and a capacitor with a first electrode and a second electrode. The capacitor is used for storing an information item and the first transistor is used for reading out or storing the information item from/to the capacitor. The first transistor has a first terminal connected to the bit line, a control terminal connected to the first word line, and a second terminal. The second transistor has a first terminal connected to the second terminal of the first transistor, a second terminal connected to the voltage potential terminal, and a control terminal connected to the first electrode of the capacitor. The third transistor has a first terminal connected to the first terminal of the second transistor, a second terminal connected to the first electrode of the capacitor, and a control terminal connected to the second word line.

One advantage of the invention is that the charge of the capacitor of the memory cell is used for switching a transistor that connects the bit line to a voltage potential. In this way, a small charge capacitance of the memory cell suffices to switch the transistor into an on state. The charge state of the memory cell is evaluated on the basis of the voltage potential. It is thus ensured that a sense amplifier receives a sufficiently large signal. Since the transistor is disposed near the capacitor of the memory cell, the charge capacitance stored in the memory cell is not impaired by long line paths. Consequently, the capacitor can be made relatively small and the charge capacitance of the storage capacitor can nevertheless still be reliably evaluated.

Preferably, a third transistor is provided, which enables an electrically conductive connection to the capacitor. The use of the third transistor results in that the capacitor can be charged.

Preferably, the transistors and the capacitor are introduced in a trench of a substrate. The substrate is produced from a semiconductor material for example. The configuration of the transistors and of the capacitor in a vertical trench results in that only a small area requirement of the surface of the substrate is needed to form the memory cell. Consequently, the configuration according to the invention is suitable for a large integration density.

In one preferred embodiment, the first transistor is formed on the surface of the substrate. The construction of the trench is simplified in this way.

In a further preferred embodiment, the first transistor is also disposed in the trench. In this way, only a very small surface is required for the configuration of the memory cell.

In a further preferred embodiment, the first and second word lines are disposed at least partly in the trench. This additionally results in a saving of surface area of the substrate. A further increase in the integration density is made possible as a result.

Preferably, at least two transistors are disposed on opposite sidewalls of the trench. An efficient utilization of the area of the trench is achieved in this way. As a result, it is possible overall to form the trench structure with a smaller depth. The transistors have conduction channels formed outside of the trench in adjoining regions in the substrate.

Preferably, the capacitor is disposed in the bottommost region of the trench and the transistors used for driving the capacitor are formed such that they lie above the region. A simple construction of the trench structure is made possible in this way.

With the foregoing and other objects in view there is further provided, in accordance with the invention, a method for fabricating a memory module. The method includes the steps of providing a substrate, forming a trench in the substrate, forming a capacitor in a bottom region of the trench, and forming a first transistor above the capacitor in a first part of a side region of the trench and in a first adjoining region of the substrate. The first transistor has a control terminal connected to a first electrode of the capacitor, and a terminal connected to a voltage potential. A second transistor is formed above the first transistor in a second part of the side region of the trench and in a second adjoining region of the substrate. The second transistor has a control terminal functioning as a word line disposed in the trench. A bit line is applied to the substrate. The bit line is electrically conductively connected to a terminal of the second transistor.

In accordance with an added mode of the invention, there is the step of forming a third transistor in a further side region of the trench and in a third adjoining region of the substrate. The third transistor has a control terminal functioning as a further word line and is disposed in the trench.

Other features which are considered as characteristic for the invention are set forth in the appended claims.

Although the invention is illustrated and described herein as embodied in a memory module having a memory cell and a method for fabricating the memory module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
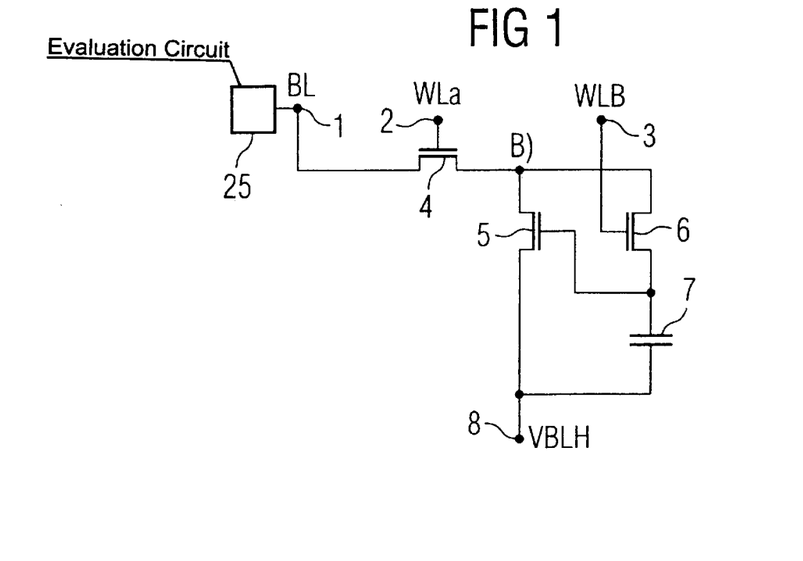
FIG. 1 is an electrical circuit diagram of a first embodiment of a memory cell according to the invention.

Referring now to the figures of the drawing in detail and first, particularly, to FIG. 1 thereof, there is shown an electrical equivalent circuit diagram of a first embodiment of a memory cell. A bit line 1 is provided, which is connected to a first terminal of a first transistor 4. A second terminal of the first transistor 4 is connected to a first terminal of a second transistor 5. A control terminal of the first transistor 4 is connected to a first word line 2. The first transistor 4 is a MOS field-effect transistor. The second transistor 2 is likewise a MOS field-effect transistor and is connected by its second terminal to a voltage source 8, which provides an adjustable voltage potential. A control terminal of the second transistor 5 is connected to a first electrode of a capacitor 7. Furthermore, the first terminal of the second transistor 5 is connected to a first terminal of a third transistor 6. A second terminal of the third transistor 6 is connected to the first electrode of the capacitor 7. The third transistor 6 is a MOS field-effect transistor and has a control input connected to a second word line 3. A second electrode of the capacitor 7 is connected to the voltage source 8.

The circuit configuration shown in FIG. 1 constitutes part of a memory module that is constructed in matrix form and has a multiplicity of memory cells. Each memory cell has the capacitor 7. The memory module has bit lines and word lines disposed in the form of a matrix. The capacitor 7 serves for storing an information item, the voltage state of the capacitor 7 is read out via the bit line 1 and evaluated by an evaluation circuit 25 connected to the bit line 1. The evaluation circuit 25 has an amplifier circuit which amplifies the voltage potential present on the bit line 1.

In order to read out the information stored in the capacitor 7, a corresponding voltage potential is applied to the first word line 2. As a consequence of this, the first transistor 4 is turned on. Depending on whether the first electrode of the capacitor 7 has stored a positive or negative voltage, the second transistor 5 is turned on or off by a voltage present at the control terminal of the second transistor 5. Consequently, the bit line 1 is or is not connected to the voltage source 8 depending on the charge stored in the capacitor 7. Since the voltage source 8 has a sufficient charge capacitance, on the bit line 1, in the event of an electrical connection of the voltage source 8 to the bit line 1, a high potential is transferred onto the bit line 1. Consequently, the evaluation circuit 25 can reliably identify the potential present on the bit line 1. Consequently, after the driving of the first word line 2, the bit line is or is not connected to the voltage source 8 depending on whether a "1" or a "0" is stored in the capacitor 7.

After the evaluation of the voltage present on the bit line 1 by the evaluation circuit 25, the voltage present on the bit line 1 can be written back to the capacitor 7 again by driving the second word line 3. To that end, a corresponding voltage is applied to the second word line 3. As a result, the third transistor 6 is turned on. Consequently, the first electrode of the capacitor 7 is connected to the bit line 1. During the writing-back operation the evaluation circuit 25 charges the first electrode of the capacitor 7 to the potential that is present on the bit line 1. In a corresponding manner, a new or different datum i.e. a different potential, can also be written to the capacitor 7 via the first bit line 1.

Figure 2:
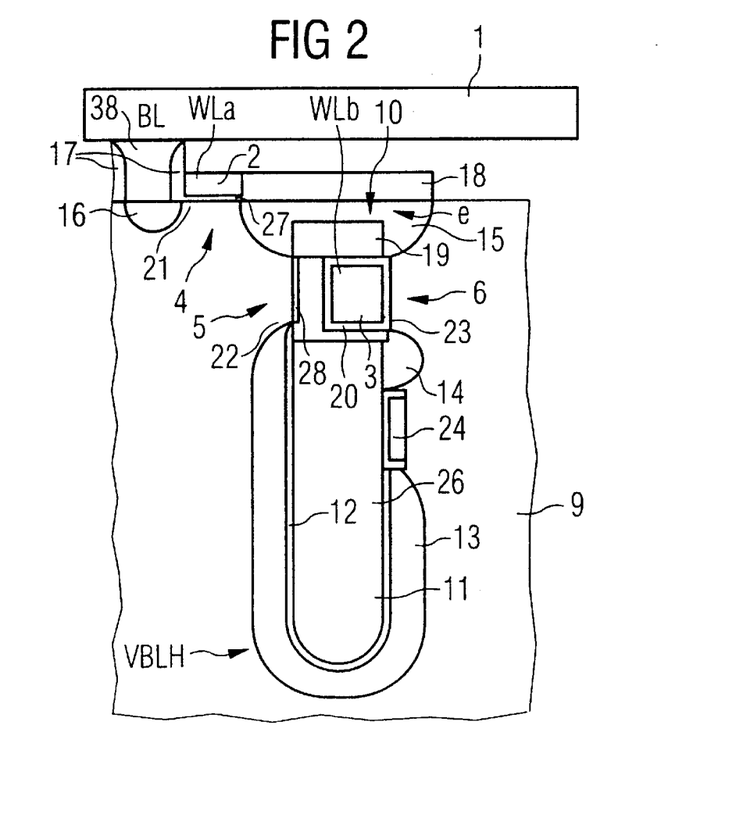
FIG. 2 is a diagrammatic, cross-sectional view through a first embodiment of the memory cell.

FIG. 2 shows a diagrammatic detail from a memory module having a memory cell in a first embodiment. The memory cell is introduced into a substrate 9 composed, for example of a positively doped silicon crystal. A vertical trench 10 is introduced into the substrate 9, the trench 10 essentially being filled with a conductive filling layer 11 containing, in particular, polysilicon. The trench 10 is surrounded by a first insulating layer 12 in a first surface region. The first insulating layer 12 is formed from silicon dioxide, for example. Adjoining the first insulating layer 12, a first conduction zone 13 is formed in the substrate 9, the zone 13 being represented for example as a negatively doped silicon layer. The first conduction zone 13 constitutes a second electrode of the capacitor 7 and is conductively connected to the voltage source 8. The filling layer 11 of the trench 10 constitutes a first electrode of the capacitor 7.

The first conduction zone 13 is formed essentially in a U-shaped manner, a second limb of the U-shape being formed such that it is shortened by a predetermined length compared with the first limb. Adjoining the shortened limb, a fifth insulating layer 24 is formed in a manner adjoining the filling layer 11. The fifth insulating layer 24 has a predetermined length and adjoins a second conduction zone 14. The second conduction zone 14 is semi-elliptical in cross section and projects with a rounded end, proceeding from the trench 10, virtually perpendicularly into the substrate 9. In an upper end region of the second conduction zone 14, a fourth insulating layer 20 is formed at an edge of the trench 10, which layer is led upward for a predetermined distance along a side area of the trench 10. Disposed at the upper end of the fourth insulating layer 20 is a third conduction zone 15, which is introduced into the substrate 9 in the form of a well and is formed as far as the upper boundary of the substrate 9. The filling layer 11 is insulated from the third conduction zone 15 by a third insulating layer 19. The third insulating layer 19 has a rectangular shape in cross section and projects into the well shape of the third conduction zone 15. Adjoining the third insulating layer 19, the second word line 3 is formed in the top right-hand region of the trench 10, the second word line 3 is electrically insulated from the surroundings of a filling 26 of the trench 10 by the fourth insulating layer 20. The second word line 3 is square in cross section and surrounded on the outer area by the fourth insulating layer 20 and the third insulating layer 19. A spacer region, in which the substrate 9 adjoins the trench 10, is prescribed between the long limb of the first conduction zone 13 and the left-hand well region of the third conduction zone 15.

An insulating covering layer 18 is applied on the third conduction zone 15 and covers the entire surface of the conduction zone 15. Adjoining the covering layer 18, the first word line 2 is disposed above an oxide layer 27 on the substrate surface of the substrate 9. Disposed beside the first word line 2 is the bit line 1 with a bit line contact 38 on the surface of the substrate 9. The bit line contact 38 is surrounded on the sidewalls by a second insulating layer 17 and thereby electrically insulated from the first word line 2. Adjoining the bit line contact 38, the substrate 9 has a fourth conduction zone 16, which is preferably hemispherical in cross section. Between the left-hand region of the third conduction zone 15 and the long limb of the first conduction zone 13, a gate oxide layer 28 is formed in the trench 10 in a manner adjoining the substrate 9, the gate oxide layer 28 adjoins both the third insulating layer 19 and the first insulating layer 12.

The first, second, third and fourth conduction zones 13, 14, 15, and 16 are preferably fabricated from negatively doped silicon. The first, second, third, fourth and fifth insulating layers 12, 17, 19, 20 and 24 are preferably formed from silicon dioxide. The bit line 1 and the first and second word lines 2, 3 are preferably fabricated from a metal layer.

The first transistor 4 is represented by the fourth conduction zone 16, the first word line 2, the left-hand region of the third conduction zone 15 and a first conduction channel 21 formed between the fourth and third conduction zones 16, 15. The second transistor 5 is formed by the left-hand region of the third conduction zone 15, the long limb of the U-shaped first conduction zone 13 and a second conduction channel 22 formed between the third conduction zone 15 and the long limb of the first conduction zone 15, 13 in the substrate 9. The third transistor 6 is represented by the right-hand part of the third conduction zone 15, the second conduction zone 14, the second word line 3 and a third conduction channel 23 formed in the substrate 9 and between the right-hand part of the third conduction zone 15 and the second conduction zone 14. A vertical configuration of the memory cell is made possible by the formation—disposed vertically one above the other—of the capacitor 7, which is formed by the filling layer 11, the first insulating layer 12 and the first conduction zone 13, and the second and third transistors formed above that essentially in the trench 10 and in the region of the substrate 9 which adjoins the trench 10. As a result, only a small surface of the substrate 9 is required for the formation of the memory cell.

The configuration of the second and third transistors 5, 6 that is chosen at opposite side areas of the trench 10 leads to a relatively shallow trench 10. As a result, the structural height of the memory module is advantageously reduced.

Instead of the doping—described in FIG. 2—of the substrate 9 and of the doping zones which form the conduction zones, it is also possible to provide an inverse doping, so that the substrate 9 is, in principal, negatively doped and the doping zones which form the conduction zones are formed such that they are positively doped.

A fabrication method for fabricating a memory cell in accordance with FIG. 2 is described diagrammatically below.

Figure 3A:
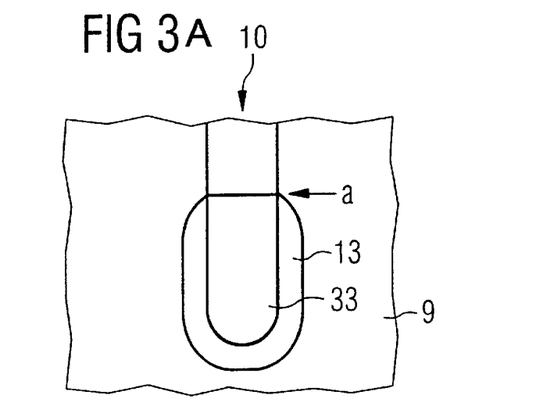
FIGS. 3A–3C, and 3E are diagrammatic, cross-sectional views of a program sequence for the fabrication of the first embodiment of the memory cell.

First, the trench 10 is etched into a substrate 9 using a hard mask and a corresponding anisotropic etching method. Afterward the trench 10 is filled up to a predetermined height a with a negative material such as e.g. an arsenic-doped glass layer 33, and, by a diffusion process, a corresponding doping layer is introduced into the region of the substrate 9 which surrounds the trench 10 (see FIG. 3A). The first doping layer constitutes part of the first conduction zone 13.

Figure 3B:
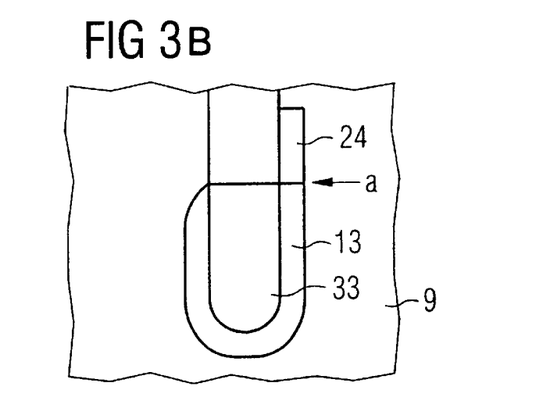
Figure 3C:
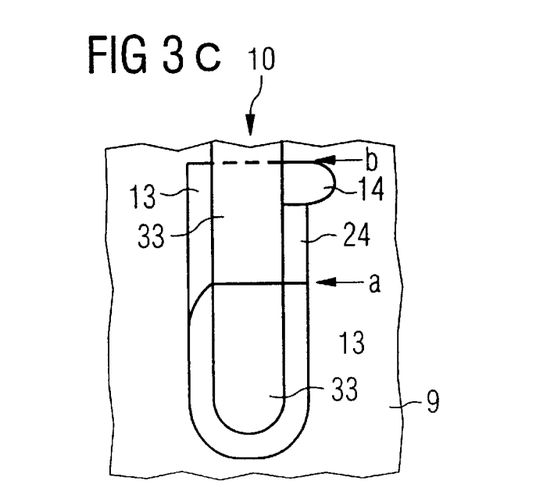

The fifth insulating layer 24 is subsequently introduced in an oxidation process (FIG. 3B). Afterward, the trench 10 is again filled with a further arsenic-doped glass layer up to a second height b and, in a second outdiffusion process, both the lengthened limb of the first conduction zone 13 and the second conduction zone 14 are fabricated in the substrate 9 (FIG. 3C).

In a subsequent method process, the entire trench 10 is etched again and the glass layer 33 is removed. In the subsequent process, the first insulating layer 12 is fabricated by an oxidation method. The trench 10 is subsequently filled with a conductive polysilicon. A second trench 34 is subsequently etched into the first trench 10 in parallel alignment with the first trench 10 as far as the first height a. A gate oxide layer 28 is then oxidized. The second trench 34 is then filled with silicon dioxide.

Figure 3D:
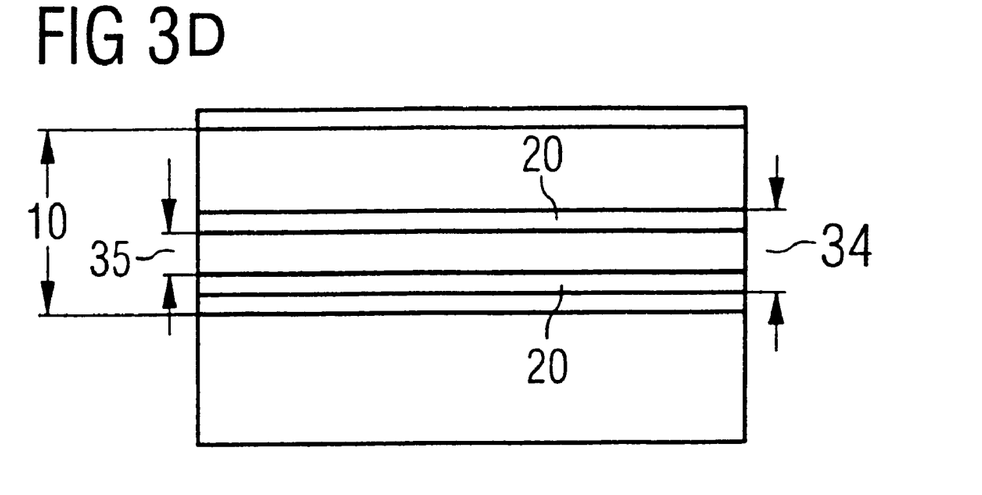
FIG. 3D is a plan view of the program sequence for fabricating the first embodiment of the memory cell.

In a further method step, a third trench 35 for the second word line 3 is etched into the second trench 34. The third trench 35 is formed parallel to the second trench 34 and has a smaller width than the second trench 34. Afterward, the fourth insulating layer 20 is introduced in an oxidation operation, which insulating layer 24 both constitutes an insulation of the second word line from the filling layer 11 of the trench 10 and forms a gate oxide layer for the third transistor (FIG. 3D).

Figure 3E:
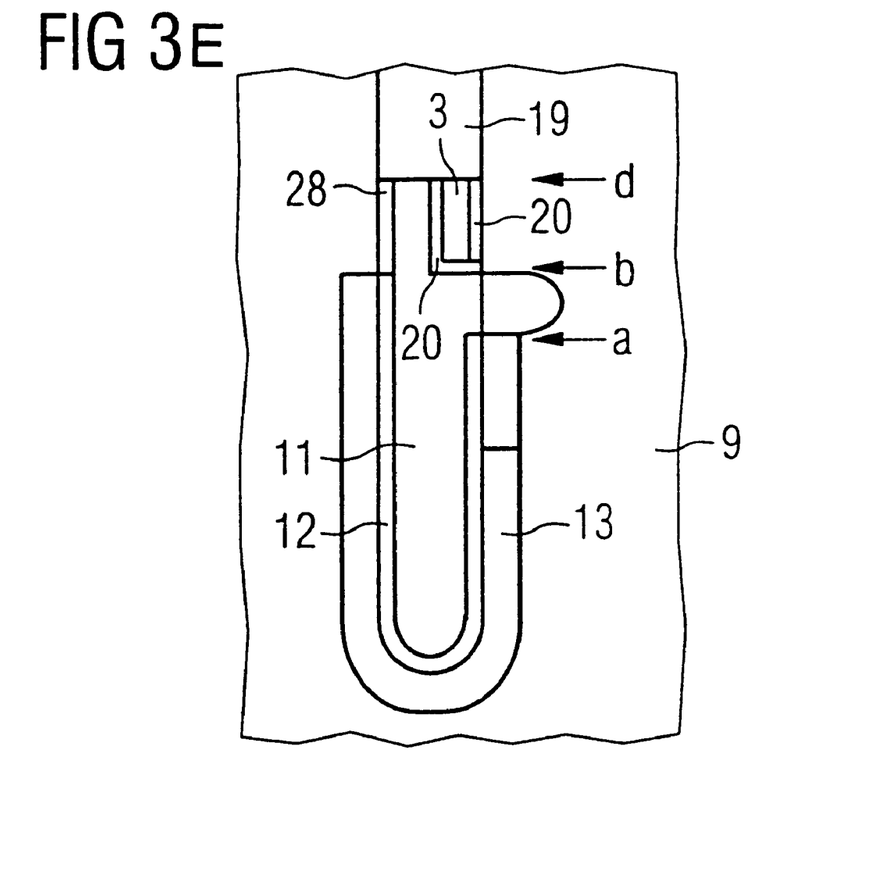

In a subsequent method step, the second word line 3 is formed as a metal filling. Afterward, the trench 10 is etched again as far as a third height d and the third insulating layer 19 is applied (FIG. 3E).

In a further method step, the trench 10 is etched back as far as a fourth height e and filled with a negatively doped material. In a subsequent outdiffusion process, the third conduction zone 15 is formed as a doping zone. Afterward, according to a standard process, the first transistor 1 is formed on the surface of the substrate 9 and a memory cell in accordance with FIG. 2 is obtained.

The method described in FIGS. 3A–3E represents a simple method for fabricating the first embodiment of the memory cell.

Figure 4:
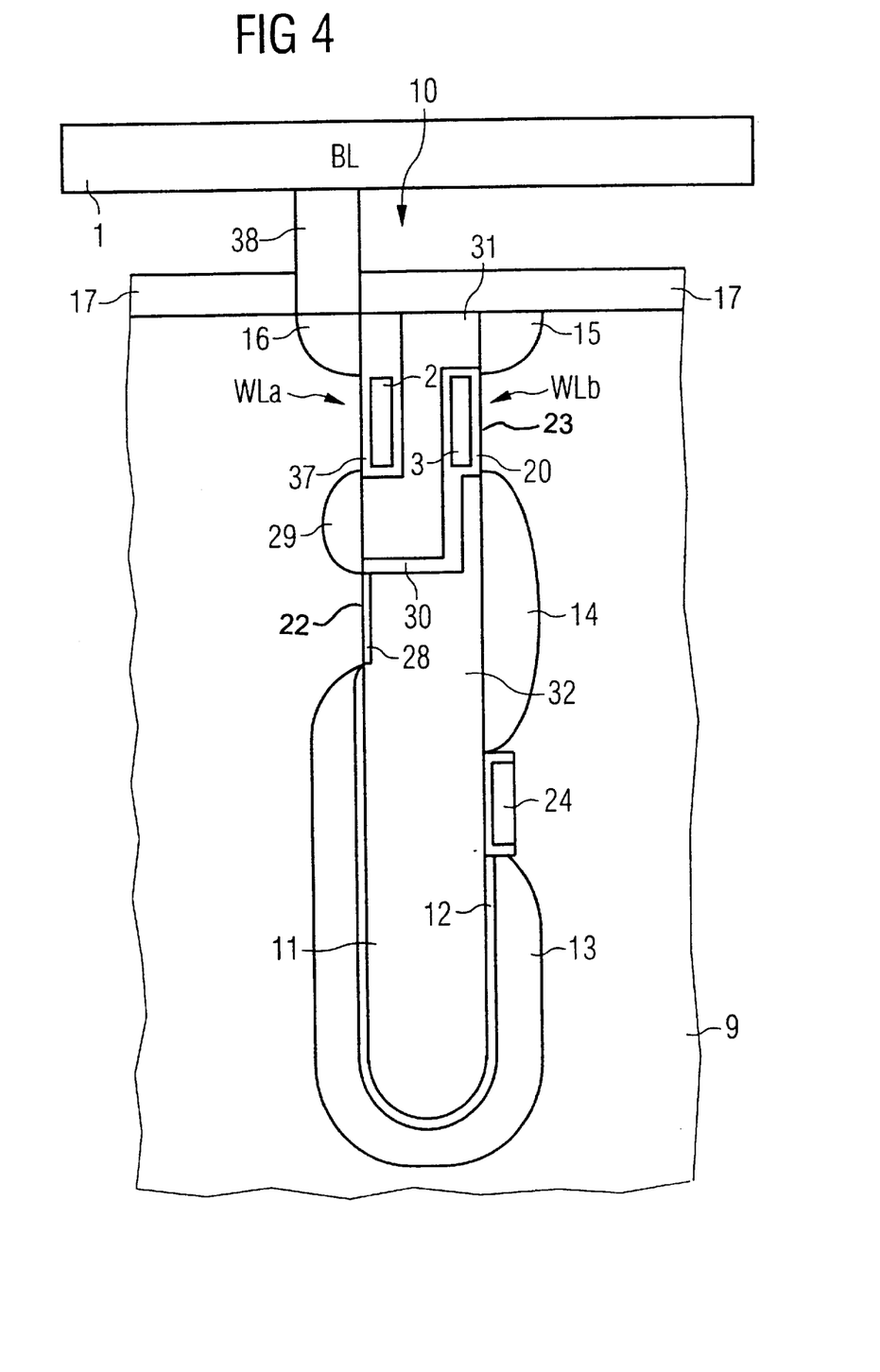
FIG. 4 is a diagrammatic, cross-sectional view through a second embodiment of the memory cell.

FIG. 4 shows a cross section through part of the memory module according to a second embodiment of a memory cell, the difference in contrast to the embodiment shown in FIG. 2 being that the first transistor is also formed in the vertical trench 10. This results in an additional reduction of surface area of the substrate 9 required for the formation of the memory cell. Consequently, a higher integration density can be achieved with this configuration. The electrical equivalent circuit diagram of the second embodiment corresponds to the electrical equivalent circuit diagram of the embodiment of FIG. 2, which is illustrated in FIG. 1.

FIG. 4 shows the substrate 9 formed, for example as a positively doped silicon crystal. Essentially the vertical trench 10 is introduced into the substrate 9, the trench 10 essentially being filled with the electrically conductive filling 11 composed, for example, of polysilicon. A rounded end region of the trench 10 is surrounded by the first insulating layer 12, which is U-shaped in cross section, a first limb being made longer than a second limb, however. The first insulating layer 12 is surrounded by the first conduction zone 13, which is essentially U-shaped in the same way as the first insulating layer 12 but has a larger thickness than the first insulating layer 12. The fifth insulating layer 24 is formed in a manner adjoining the short limb of the first insulating layer 12 and of the first conduction zone 13, which layer is led along the sidewall of the trench 10 for a predetermined distance and has a predetermined thickness. The fifth insulating layer 24 is preferably rectangular in cross section. The upper end of the fifth insulating layer 24 is disposed below the end of the long limb of the first conduction zone 13. The second conduction zone 14 is formed in a manner adjoining the upper end of the fifth insulating layer 24, which zone, proceeding from the fifth insulating layer 24, extends along the side area of the trench 10 for a predetermined distance. Adjoining the upper end region of the second conduction zone 14, in the trench 10, the electrically insulated second word line 3 is formed on the right-hand edge region of the trench 10. Above the second word line 3, the third conduction zone 15 is formed in the substrate 9 in a manner adjoining the trench 10 and the second word line 3, which zone reaches as far as the surface of the substrate 9 and has the shape of a partial circle in cross section.

Opposite the second word line 3, the first word line 2 is formed in the left-hand edge region of the trench 10, and is likewise electrically insulated from the filling 11 by a seventh insulating layer. At the lower end region of the first word line 2, a fifth conduction zone 29 is formed in the substrate 9 in a manner adjoining the trench 10. The fifth conduction zone 29 is disposed a predetermined distance above the long limb of the first conduction zone 13.

Above the first word line 2, the fourth conduction zone 16 is formed in the substrate 9 in a manner adjoining the trench 10, which zone extends as far as the surface of the substrate 9. Above the fourth conduction zone 16, the bit line contact 38 of the bit line 1 is applied on the surface of the substrate 9. The fourth conduction zone 16 is electrically conductively connected to the bit line 1. The remaining surface of the substrate 9 is covered by a second insulating layer 17.

The second word line 3 is surrounded by the fourth insulating layer 20, which electrically insulates the second word line 3 from the substrate 9 and from the filling 26 of the trench 10. The fourth insulating layer 20 is connected to a fifth insulating layer 30, which is led transversely through the filling 11 as far as the opposite edge region of the trench 10 and adjoins the sidewall of the trench 10 in the lower end region of the fifth conduction zone 29. The fifth insulating layer 30 and the fourth insulating layer 20 subdivide the filling 11 of the trench 10 into an upper filling region 31 and a lower filling region 32 which are electrically insulated from one another.

In the edge region of the trench 10, the gate oxide layer 28 is formed in the substrate 9 between the fifth conduction zone 29 and the long limb of the first conduction zone 13. The gate oxide layer 28 constitutes an insulating layer between the substrate 9 and the filling 11.

The first transistor 4 is represented by the fourth conduction zone 16, the first word line 2, the first conduction zone 29 and the channel between the fourth and fifth conduction zones 16, 29.

The second transistor 5 is represented by the fifth conduction zone 29, the end region of the long limb of the first conduction zone 13 and the lower filling region 32. In the event of corresponding driving of the lower region of the filling 11, the electrically conductive second conduction channel 22 is formed between the fifth and first conduction zones 30, 13 in the substrate.

The third transistor 6 is formed by the third conduction zone 15, the second conduction zone 14, the second word line 3 and the third conduction channel 23 that is formed in the event of corresponding driving of the second word line 3 between the third conduction zone 15 and the second conduction zone 14.

The capacitor 7 is formed by the lower region of the filling 11, the first insulating layer 12 and the first conduction zone 13. The first conduction zone 13 is electrically conductively connected to the voltage source 8.

In the event of corresponding driving of the first word line 2 the first transistor 4 is turned on. If the capacitor 7 has a charge of corresponding magnitude, then the second transistor 5 is also turned on, so that the bit line 1 is electrically conductively connected to the voltage source 8. In order to write a charge information item to the capacitor 7, a predetermined voltage is applied to the second word line 3, so that the third transistor 6 becomes electrically conductive and the voltage present on the bit line 1 is stored via the first transistor and the third transistor in the lower filling region 32 and thus in the capacitor 7.

The first, second, third, fourth and fifth conduction zones 13, 14, 15, 16, 29 are preferably formed as negatively doped silicon regions. The first, second, third, fourth, fifth and sixth insulating layers 12, 17, 19, 20, 24, 30 are preferably fabricated from silicon dioxide. Instead of the doping polarity illustrated in FIG. 4, it is also possible for the substrate 9 to be negatively doped and the conduction zones positively doped. The bit line 1, the bit line contact 38 and the first and second word lines 2, 3 are fabricated from a metallic material.

Figure 5A:
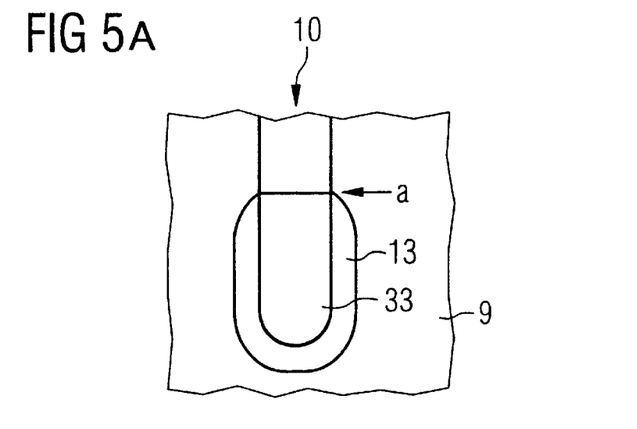
FIGS. 5A, and 5C–5F are diagrammatic, sectional views of a method sequence for the fabrication of the second embodiment of the memory cell.

FIGS. 5A–5F shows a diagrammatic method sequence for fabricating the memory cell in accordance with FIG. 4. In a first method step, the trench 10 is etched into a positively doped silicon substrate 9 using an etching mask. Afterward, in a second method step the trench 10 is filled with a negatively doped material, such as e.g. the arsenic-doped glass layer 33, up to a first height a. In a subsequent outdiffusion process, a first diffusion layer is fabricated in the region of the substrate 9, which layer surrounds the trench 10 up to the first height a. The first diffusion region constitutes part of the first conduction zone 13 (FIG. 5A).

Figure 5B:
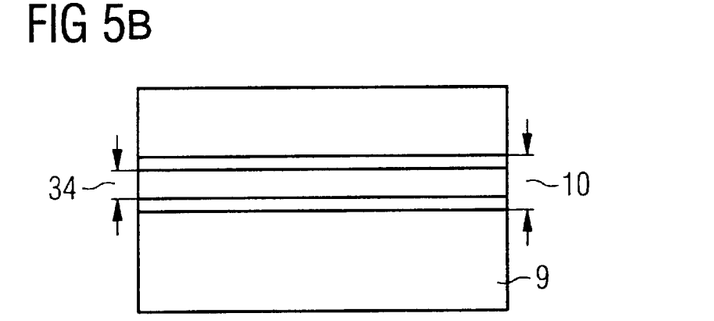
FIG. 5B is a plan view of the method sequence for fabricating the second embodiment of the memory cell.
Figure 5C:
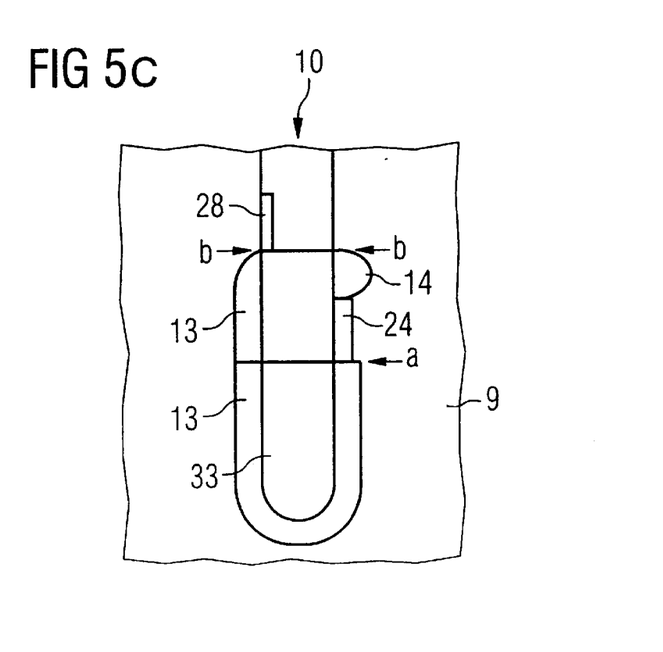

A second trench 34 is subsequently etched into the first trench 10 in parallel alignment with the first trench 10 as far as the first height a. FIG. 5B shows a view from above of the first and second trenches 10, 34. In a subsequent method step, the fifth insulating layer 24 is introduced into the substrate 9 by an oxidation process. Afterward, the first and second trenches are filled with negatively doped material, such as e.g. an arsenic-doped glass layer 33, up to the second height b and, in a subsequent diffusion process, a second doping zone is fabricated, which constitutes the upper part of the long limb of the first conduction zone 13 and the lower part of the second conduction zone 14. The gate oxide layer 28 is subsequently introduced into the substrate 9 in a further oxidation process (FIG. 5C).

Figure 5D:
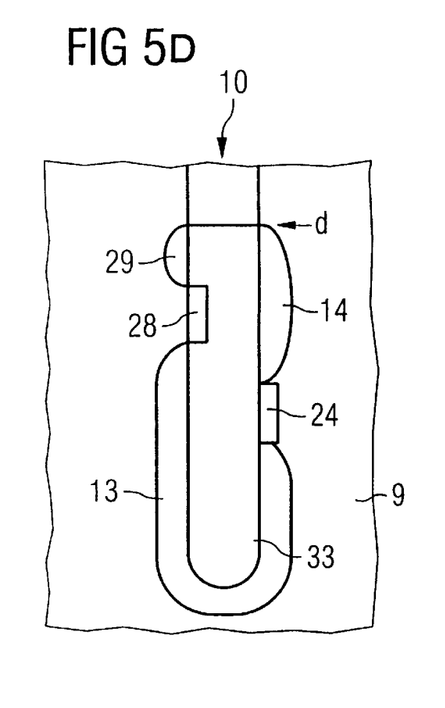

The trench 10 is then filled with a negative doping material, such as e.g. an arsenic glass layer, up to a third height d. In a subsequent diffusion process, the fifth conduction zone 29 and a further section of the second conduction zone 14 are diffused into the substrate 9 (FIG. 5D).

Afterward, the entire trench 10 is completely etched free again in an etching method. The first insulating layer 12 is oxidized in a subsequent method step.

Figure 5E:
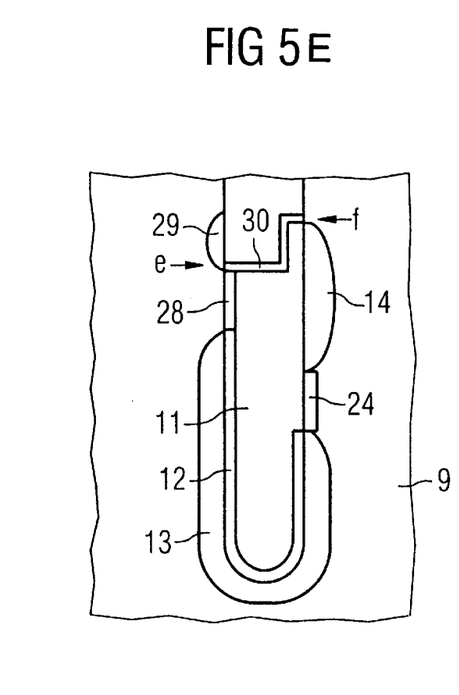

The trench 10 is then filled with conductive polysilicon as the filling 26. In a subsequent method step, the third trench 35 for the first word line 2 is etched parallel to the longitudinal direction of the trench 10 as far as a third depth d.

A fifth trench is subsequently etched into the filling 11 as far as the second height b. In a subsequent method step, the sixth insulating layer 30 is applied to the lower stepped filling region 32 of the trench 10 (FIG. 5E).

In a further method step, the upper empty region of the trench 10 is further filled with conductive polysilicon as the filling 11.

Afterward, the walls of the third trench 35 are covered with an oxide layer representing the seventh insulating layer 37. Afterward, the third trench 35 is provided with a metallic filling and the first word line 2 is fabricated as a result. Finally the third trench 35 is filled with an oxide layer.

Figure 5F:
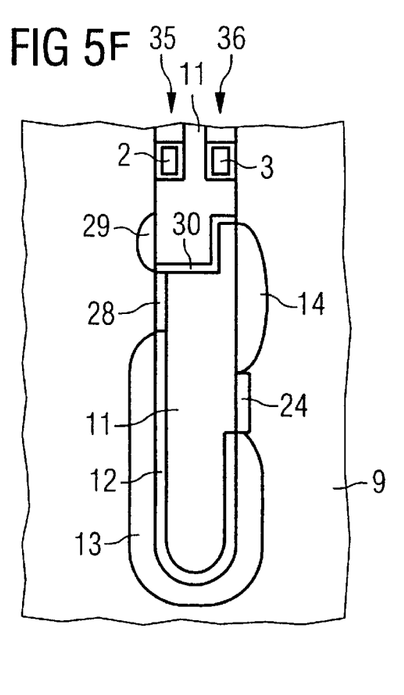

Afterward, in a further method step, a fourth trench 36 is etched parallel to the trench 10 as far as the fourth height f. The fourth trench 36 is filled with silicon dioxide as fifth insulating layer 24. Afterward, a trench for the word line is etched into the fourth trench 36, the fifth trench is filled with a metallic material and the third word line 3 is fabricated as a result. An oxide layer is subsequently applied to the metallic filling of the fourth trench 36 (FIG. 5F).

The upper region of the fourth trench is subsequently filled. The source terminals of the first and third transistors 4, 6 are then implanted. The second insulating layer 17 is subsequently applied to the surface of the substrate 9. Afterward, in the region above the fourth conduction zone 16, a terminal hole is etched into the second insulating layer 17 and the bit line 1 is vapor-deposited from a metallic material. A memory cell in accordance with FIG. 4 is thus obtained.

I claim:

1. A memory module, comprising:
   a voltage potential terminal for a voltage potential;
   a bit line;
   a first word line;
   a second word line; and
   a memory cell having a first transistor, a second transistor, a third transistor, and a capacitor with a first electrode and a second electrode, said capacitor used for storing an information item and said first transistor used for reading out or storing the information item from/to said capacitor, said first transistor having a first terminal connected to said bit line, a control terminal connected to said first word line, and a second terminal, said second transistor having a first terminal connected to said second terminal of said first transistor, a second terminal connected to said voltage potential terminal, and a control terminal connected to said first electrode of said capacitor, said third transistor having a first terminal connected to said first terminal of the second transistor, a second terminal connected to said first electrode of said capacitor, and a control terminal connected to said second word line.

2. The memory module according to claim 1, further comprising a substrate having a trench formed therein and said memory cell is formed in said substrate, at least said second transistor and said capacitor are disposed in said trench in a region of said substrate adjoining said trench.

3. The memory module according to claim 2, wherein said substrate has a surface and said first transistor is formed on said surface.

4. The memory module according to claim 2, wherein said first transistor is formed in said trench in said region of said substrate adjoining said trench.

5. The memory module according to claim 2, wherein said first word line and said second word line are disposed at least partly in said trench.

6. The memory module according to claim 2, wherein:
   said trench has opposite sidewalls; and
   said first, second and third transistors have conduction channels, and at least two of said first, second and third transistors are disposed on said opposite sidewalls of said trench and said conduction channels are formed outside said trench in regions adjoining said substrate.

7. The memory module according to claim 2, wherein said capacitor is formed in a lower end region of said trench.

8. A method for fabricating a memory module, which comprises the steps of fabricating the memory module of claim 1 by:
   providing a substrate;
   forming a trench in the substrate;
   forming said capacitor in a bottom region of the trench;
   forming said second transistor above the capacitor in a first part of a side region of the trench and in a first adjoining region of the substrate, the second transistor having said control terminal connected to said first electrode of the capacitor and said second terminal connected to the voltage potential;
   forming said first transistor above the second transistor in a second part of the side region of the trench and in a second adjoining region of the substrate, the first transistor having said control terminal functioning as said first word line disposed in the trench;
   forming said third transistor in a further side region of the trench and in a third adjoining region of the substrate; and
   applying said bit line to the substrate, the bit line electrically conductively connected to said first terminal of the first transistor.

9. The method according to claim 8, which comprises providing the third transistor having said control terminal functioning as said second word line and disposed in the trench.

10. The method according to claim 9, which comprises forming the second and third transistors on opposite sidewalls of the trench and onto adjoining parts of the substrate.

* * * * *